(12) United States Patent
Frana et al.

(10) Patent No.: US 9,060,417 B2
(45) Date of Patent: Jun. 16, 2015

(54) DEVICE FOR ATTENUATING PROPAGATION OF ELECTROMAGNETIC EMISSIONS FROM AN ENCLOSURE

(71) Applicant: International Business Machines Corporation, Armonk, NY (US)

(72) Inventors: Andrew J. Frana, Oronoco, MN (US); Edward C. Gillard, Mantorville, MN (US); Don A. Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 14/045,006

(22) Filed: Oct. 3, 2013

(65) Prior Publication Data

US 2015/0096799 A1    Apr. 9, 2015

(51) Int. Cl.
H05K 9/00    (2006.01)

(52) U.S. Cl.
CPC .................................... *H05K 9/0015* (2013.01)

(58) Field of Classification Search
CPC .................................................. H05K 9/0015
USPC ........................................ 174/368, 354, 384
See application file for complete search history.

(56) References Cited

U.S. PATENT DOCUMENTS

| | | | |
|---|---|---|---|
| 4,659,869 A | 4/1987 | Busby | |
| 5,107,071 A * | 4/1992 | Nakagawa | 174/358 |
| 5,120,903 A * | 6/1992 | Tam | 174/354 |
| 5,142,101 A * | 8/1992 | Matsuzaki et al. | 174/354 |
| 5,569,877 A * | 10/1996 | Yumi | 174/366 |
| 5,957,465 A | 9/1999 | Gonsalves et al. | |
| 6,116,615 A * | 9/2000 | Trehan | 277/630 |
| 6,483,023 B1 | 11/2002 | Jacques | |
| 6,624,432 B1 | 9/2003 | Gabower et al. | |
| 6,643,918 B2 | 11/2003 | Ortiz et al. | |
| 6,667,435 B1 | 12/2003 | French et al. | |
| 6,943,288 B1 | 9/2005 | Miska | |

OTHER PUBLICATIONS

Limpaecher et al., "Development of a Low-EMI Advanced Variable Speed Drive for Shipboard Applications," ESTS '07: Electric Ship Technologies Symposium, 2007, IEEE, pp. 478-482, Arlington, Virginia, May 21-23, 2007, © 2007 IEEE. DOI: 10.1109/ESTS.2007. 372129.

* cited by examiner

*Primary Examiner* — Hung V Ngo
(74) *Attorney, Agent, or Firm* — Penny L. Lowry; Robert Williams

(57) ABSTRACT

A first planar prong adjacent to and parallel with, an exterior of the side of the enclosure. A second planar prong parallel to and spaced from an interior of the side of the enclosure and compress a first compressible gasket against the side of the enclosure. Furthermore, the second planar prong forms a first compartment between a first side of the second planar prong and the interior of the side of the enclosure, parallel to and spaced from an interior of the side of the enclosure. A planar base of the first planar prong and the second planar prong, adjacent to a cover of the enclosure. A first planar member having one end coupled perpendicular to a second side of the second planar prong and support a second compressible gasket in a second compartment formed between the planar member and the cover.

19 Claims, 3 Drawing Sheets

DEVICE FOR ATTENUATING PROPAGATION OF ELECTROMAGNETIC EMISSIONS FROM AN ENCLOSURE

FIELD OF INVENTION

This disclosure relates generally to electromagnetic interference, and more specifically, to controlling the level of emissions of electromagnetic interference emitted and received from an electronic enclosure.

BACKGROUND

Electromagnetic Interference (EMI) is a disturbance that interrupts, obstructs, degrades, or limits the effective performance of electronics and electrical equipment. It can occur unintentionally as a result of spurious emissions and responses. Electromagnetic compatibility (EMC) tries to ensure that equipment items or systems will not interfere with or prevent the correct operation of other equipment items or systems through emission or absorption of EMI. The damaging effects of EMI pose unacceptable risks in many areas of technology and it is necessary to control EMI and reduce the risks to acceptable levels.

SUMMARY

Disclosed herein are embodiments of a device for attenuating the propagations of electromagnetic emissions when installed in an enclosure, the device comprising a two-prong member. The first planar prong configured to be substantially adjacent to and substantially parallel with an exterior of the side of the enclosure. The second planar prong configured to be substantially parallel to and spaced from an interior of the side of the enclosure and configured to compress a first compressible gasket against the side of the enclosure. Furthermore, the second planar prong forms a first compartment between a first side of the second planar prong and the interior of the side of the enclosure, substantially parallel to and spaced from an interior of the side of the enclosure. Also, the two prong member may have a planar base of the first planar prong and the second planar prong substantially adjacent to the cover. In addition, the device may include a first planar member having one end coupled substantially perpendicular to a second side of the second planar prong and configured to support a second compressible gasket in a second compartment formed between the planar member and the cover.

Also disclosed herein are embodiments of a kit for attenuating propagation of electromagnetic emissions when installed in an enclosure. In an embodiment, the kit may comprise, a first compressible gasket, a second compressible gasket, and a device. In an embodiment the device may comprise, a two-prong member. The first planar prong configured to be substantially adjacent to and substantially parallel with an exterior of the side of the enclosure. The second planar prong configured to be substantially parallel to and spaced from an interior of the side of the enclosure and configured to compress a first compressible gasket against the side of the enclosure. Furthermore, the second planar prong forms a first compartment between a first side of the second planar prong and the interior of the side of the enclosure, substantially parallel to and spaced from an interior of the side of the enclosure. Also, the two prong member may have a planar base of the first planar prong and the second planar prong substantially adjacent to the cover. In addition, the device may include a first planar member having one end coupled substantially perpendicular to a second side of the second planar prong and configured to support a second compressible gasket in a second compartment formed between the planar member and the cover.

Also disclosed herein are embodiments of a system for attenuating propagation of electromagnetic emissions, the system comprising an enclosure having a side, and a cover, that when closed, is substantially adjacent to an end of the side. In an embodiment, the system may include a first compressible gasket and a second compressible gasket. In addition, the system may have a device comprising a two-prong member. The first planar prong configured to be substantially adjacent to and substantially parallel with an exterior of the side of the enclosure. The second planar prong configured to be substantially parallel to and spaced from an interior of the side of the enclosure and configured to compress a first compressible gasket against the side of the enclosure. Furthermore, the second planar prong forms a first compartment between a first side of the second planar prong and the interior of the side of the enclosure, substantially parallel to and spaced from an interior of the side of the enclosure. Also, the two prong member may have a planar base of the first planar prong and the second planar prong substantially adjacent to the cover. In addition, the device may include a first planar member having one end coupled substantially perpendicular to a second side of the second planar prong and configured to support a second compressible gasket in a second compartment formed between the planar member and the cover.

DETAILED DESCRIPTION

Figure 1:
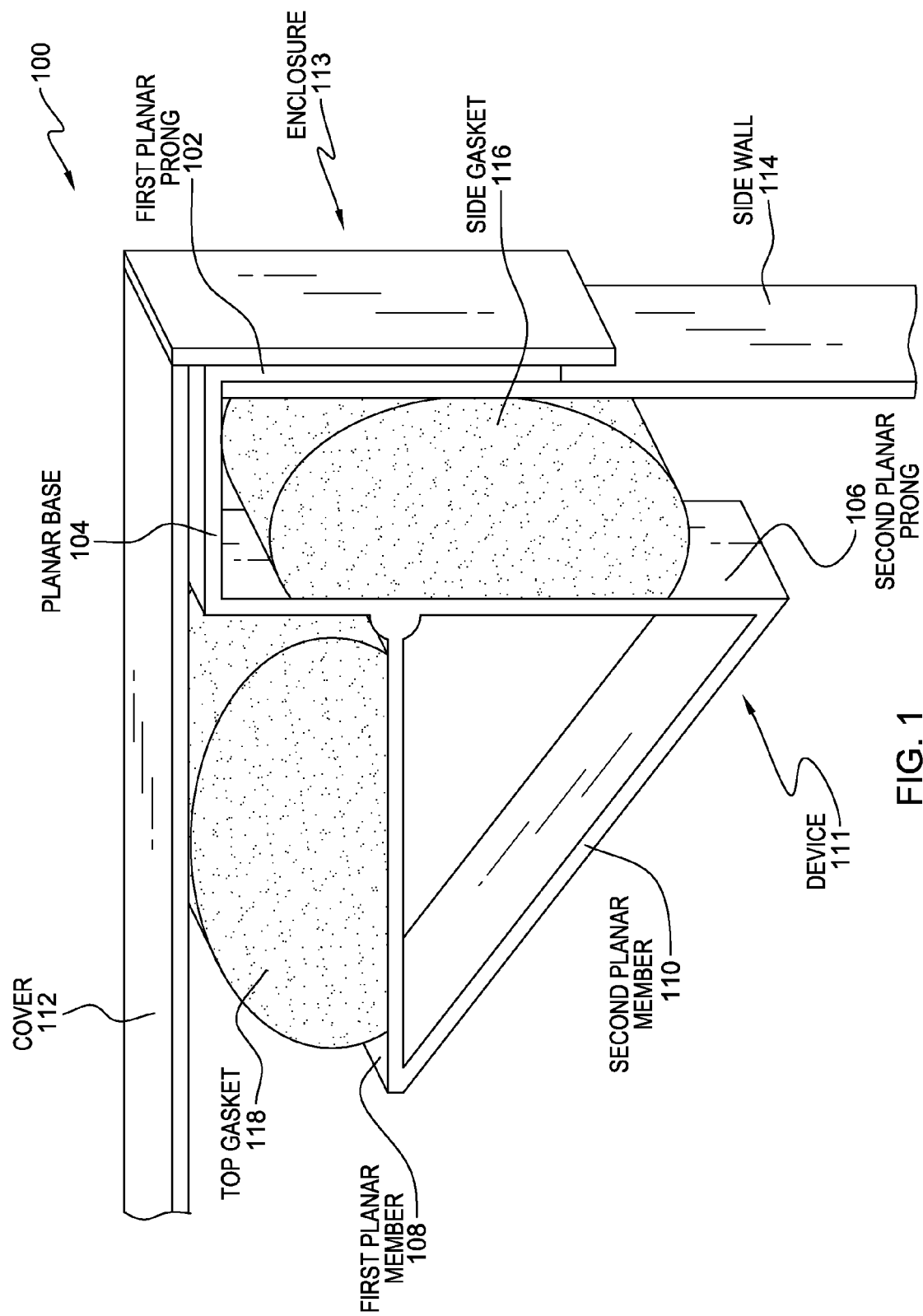
FIG. 1 depicts a system for attenuating the propagation and reception of electromagnetic emissions, consistent with embodiments of the present disclosure.

Electromagnetic energy from sources external or internal to electrical equipment affects that equipment adversely by causing it to have undesirable responses, such as degraded performance or malfunctions. When this occurs, the electromagnetic energy is called electromagnetic interference (EMI), and the adversely affected equipment is said to be susceptible to EMI.

EMI is radiated through openings of any kind in equipment enclosures: ventilation, access, cable or meter holes; around the edges of doors, hatches, drawers, and panels; and through imperfect joints in the enclosures. EMI may also be radiated from leads and cables leaving a source, or picked up by leads and cables entering a susceptible device.

The purpose of electromagnetic shields is to attenuate EMI between sources and susceptible equipment. One explanation of how shields work is that EMI fields induce circulation currents in the shields, and the fields set up by those circulating currents oppose the EMI fields, so that the net fields on the 'shielded' side are reduced. Another explanation is that shields attenuate EMI fields by a combination of reflection and absorption. Furthermore, the law of reciprocity applies. The shield is thought of as containing EMI from a source, or excluding EMI from susceptible equipment. For a shielded source, the EMI level outside the shield will be greatly reduced below the level inside the shield, and all susceptible equipment will be benefited. When an electromagnetic wave impinges on a shield, some of its energy is reflected at the surface of the shield, some is absorbed by the shield, and some is transmitted through the shield.

For maximum isolation, an enclosure, acting as a shield, should be fabricated from a single, homogeneous piece of material, without seams, joints, or openings. When an opening must be provided for periodic inspection, maintenance, repair, or other purpose, it can be equipped with a cover, door, window, or panel of the same material as the enclosure, with a tight, overlapping joint. However, this joint represents an anomaly in the continuity of the enclosure surface, and is subject to leakage. A gasket may seal this kind of joint in such a way as to restore the shielding integrity of the enclosure as an essentially one piece element. When a gasket of resilient material is installed between the surfaces, and closure pressure is applied, the gasket conforms itself to the irregularities in both mating surfaces, and accommodates itself to the gradations in local compressions throughout the joint, thus helping to seal the enclosure. However, there may still be gaps where EMI emissions can propagate.

In another example, an electronic device inside a single piece conductive shell can be protected because current from electromagnetic waves cannot be conducted into the inside of the shell. The conductive shell does not entirely absorb electromagnetic field, but has current running along its surface that creates a separate electromagnetic field to cancel the effects of the original field. As electromagnetic currents typically take the path of least resistance, they run along the exterior of the protective shell. Any gap or opening in the shell, however, will attract the current and cause it to pass through the protective shell, no matter how small the opening.

A system enclosure with an overlying cover with inadequate overlap and gasketing has been shown to leak and absorb electromagnetic emissions. Often, neither the cover nor sides of an enclosure can be changed for some existing products. Furthermore, a gasket placed inside the top corner can interface with the edge, but it is well known that the gasket that contacts the edge of a sheet metal enclosure provides poor shielding effectiveness due to high impedance presented at the gasket and edge contact.

Embodiments herein provide a device and system for attenuating the propagation of electromagnetic emissions when installed in an enclosure. In order to address the problem, two gaskets, one compressed by a cover of the enclosure and one compressed by a side wall of the enclosure, are placed into the enclosure. The conductive device holding the gaskets is formed in a shape that is captured by the side wall and the cover of the enclosure. The device may be thin enough to fit between the overlapped joint. Furthermore, the device is shaped such that a compression force from the cover of the enclosure to the top gasket translates to the side gasket and vice versa.

Turning now to the figures, FIG. 1 depicts a system 100 for attenuating the propagation and reception of electromagnetic emissions, consistent with embodiments of the present disclosure. The system 100 may include a device 111, an enclosure 113, a side gasket 116, and a top gasket 118. The device 111 may include a first planar prong 102, a planar base 104, a second planar prong 106, a first planar member 108, and a second planar member 110. The enclosure 113 may include a cover 112 and a side wall 114.

The first planar prong 102 may be present on the device 111 and may be composed of a conductive material. The conductive material may allow for the moveability of the current carrying charged particles, known as electrons, better than other materials like insulators. The use of a conductive material for the first planar prong 102 may maintain a lower impedance connection between the first planar prong 102 and the enclosure 113, than if an insulating material is used, therefore, providing a better connection for the signal to travel along the enclosure 113.

The first planar prong 102 may be configured in such a way that it may help stabilize the device 111. For instance, when the device 111 is in place, the first planar prong 102 may have a force exerted on it from the force a cover 112 exerts on the other members of the device 111. The force exerted by the cover 112 may be translated to the first planar prong 102. The first planar prong 102 may be thin enough to fit between the exterior side of a side wall 114 and a side of the cover 112. When the force is exerted on the first planar prong 102, the first planar prong 102 may translate the force onto the side of the cover 112, and based on Newton's Third Law, for every force there is an equal and opposite force, the side of the cover 112 may exert the force back onto the first planar prong 102. Because the first planar prong 102 is between the exterior side of the side wall 114 and the side of the cover 112, then the first planar prong 102 may exert the force on the exterior side of the side wall 114, stabilizing the first planar prong 102 and the rest of the device 111.

Consistent with certain embodiments, a planar base 104 may be coupled to the first planar prong 102 of the device 111 and may be composed of conductive material. The planar base 104 may be configured in such a way that it may also help stabilize the device 111. For instance, when the device 111 is in place, the planar base 104 may have a force exerted on it from the force the cover 112 exerts on the other members of the device 111. The force exerted by the cover 112 may be translated to the planar base 104. The planar base 104 may translate the force back onto the cover 112. Based on Newton's Third Law, the cover 112 may exert the force back onto the planar base 104. Then, because the planar base 104 may be coupled to the first member 102, the planar base 104 may translate some of the force to the first planar prong 102 and help stabilize the planar base 104 and the rest of the device 111.

Furthermore, the planar base 104 may be formed in a shape that is captured by the cover 112. As mentioned herein, an enclosure 113 does not entirely absorb an electromagnetic field, but has current running along its surface and current typically takes the path of least resistance. Therefore, EMI may be transmitted when the enclosure 113 does not have a direct, low-resistive path. When the planar base 104 is formed in a shape that is captured by the cover 112, the device 111 may establish a surface contact with the cover 112, which may exhibit lower impedance than a point contact. This may decrease the EMI emissions that could have propagated.

The width of the planar base 104 may also be wide enough to adequately hold a side gasket 116 and help define a compartment for the side gasket 116. As mentioned herein, a gasket can help seal enclosure 113 when force is applied. This may decrease the EMI emissions that could have propagated. Furthermore, gaskets require some amount of compressive force to function properly. As a result, the side gasket 116 may decrease in height. Many gaskets may need to be compressed to 40% of their original height to maintain adequate contract and maintain sealing properties.

In certain embodiments, a second planar member 106 may be coupled to the planar base 104 of the device 111 and may be comprised of conductive material. The second planar prong 106 may be configured in such a way that it is substantially parallel to the side wall 114 and spaced from the side wall 114 by a distance that helps define a compartment and can adequately hold the side gasket 116 when a force is applied to the second planar prong 106. For instance, a force may be exerted by the cover 112 onto other members of the device 111. The force may be translated to the second planar prong 106 and the second planar prong 106 may exert the force onto the side gasket 116 that is being held into place in the compartment that helps define by the second planar prong 106, the planar base 104, and the side wall 114. The side gasket 116 may exert the force on the side wall 114, and based on Newton's Third Law, the side wall 114 may exert the force back on the side gasket 116, holding the side gasket 116 in place.

Consistent with various embodiments, a first planar member 108 may be coupled to a side of the second planar prong 106 of the device 111, opposite the compartment that the side gasket 116 may be placed. Furthermore, the first planar member may be composed of a conductive material. The first planar member 108 may be configured in such a way that it is substantially perpendicular to the second planar prong 106, substantially parallel to the cover 112, and spaced from the cover 112 by a distance that defines a height of a compartment that can adequately hold a top gasket 118 when a force is applied to the first planar member 108. For instance, a force may be exerted by the cover 112 onto the top gasket 118. The force may be translated to the first planar member 108 and the first planar member 108 may translate some of the force onto the second planar prong 106 by way of the coupling to the second planar prong 106. Furthermore, based on Newton's Third Law, the first planar member 108 may exert the force back on the top gasket 118, holding the top gasket 118 in place between the cover 112 and the first planar member 108.

In certain embodiments, a second planar member 110 may be coupled to an end of the second planar prong 106 and an end of the first planar member 108 of the device 111 and may be composed of a conductive material. The second planar member 110 may be configured in such a way that it provides additional support for the second planar prong 106 and the first planar member 108. For instance, when the force is applied from the cover 112 and is translated throughout the device 111, the force applied at the coupling points of the second planar prong 106 and the first planar member 108, may be substantial. By coupling the second planar member 110 to the ends of the second planar prong 106 and the first planar member 108, the force may be distributed more evenly across the members and possibly eliminate damage to the device 111.

Figure 2:
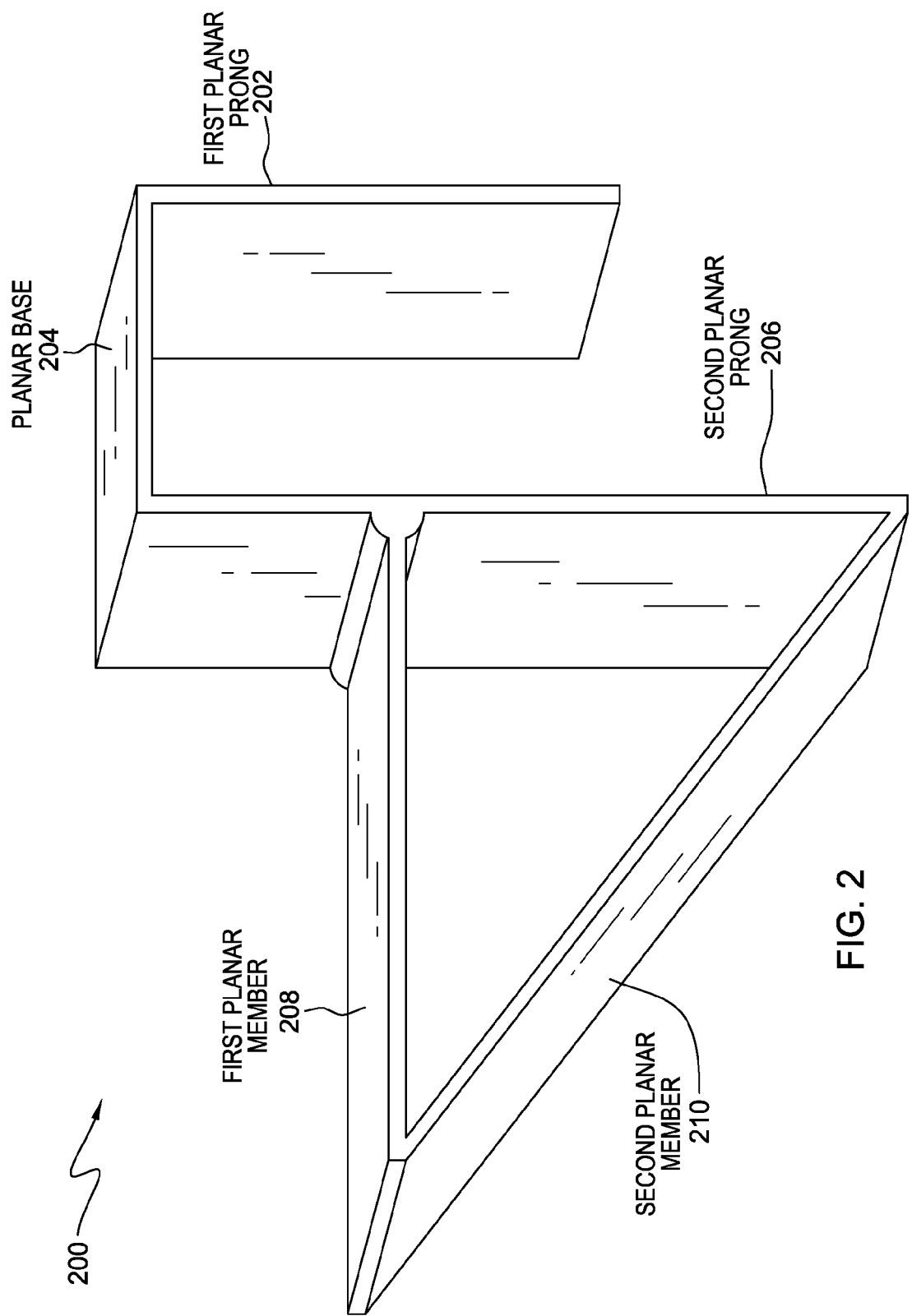
FIG. 2 depicts a device for attenuating the propagation and reception of electromagnetic emissions, consistent with embodiments of the present disclosure.

FIG. 2 depicts a device 200 for attenuating the propagation and reception of electromagnetic emissions, consistent with embodiments of the present disclosure. A first planar prong 202 may be present on the device 200 and may be composed of conductive material. The conductive material may allow for the movability of the current carrying charged particles, known as electrons, better than other materials like insulators. The use of a conductive material for the first planar prong 202 may maintain a lower impedance connection between the first planar prong 202 and the enclosure 113, from FIG. 1, than if an insulating material is used, therefore, providing a better connection for the signal to travel along the enclosure 113.

The first planar prong 202 may be configured in such a way that it may help stabilize the device 200 in the enclosure 113. For instance, when the device 200 is placed into an enclosure 113 and the cover 112, from FIG. 1, is placed into position on the enclosure 113, the first planar prong 202 may have a force exerted on it from the force the cover 112 exerts on the other members of the device 200. The force exerted by the cover 112 may be translated to the first planar prong 202 and the first planar prong 202 may be thin enough to fit between the exterior side of the side wall 114, from FIG. 1, of the enclosure 113 and a side of the cover 112. When the force is exerted on the first planar prong 202, the first planar prong 202 may translate the force onto the side of the cover 112, and based on Newton's Third Law, for every force there is an equal and opposite force, the side of the cover 112 exerts the force back onto the first planar prong 202. Then, because the first planar prong 202 is between the exterior side of the side wall 114 of the enclosure 113 and the side of the cover 112, the first planar prong 202 may exert the force on the exterior side of the side wall 114, stabilizing the first planar prong and the rest of the device 200.

Consistent with certain embodiments, a planar base 204 may be coupled to the first planar prong 202 of the device 200 and may be composed of a conductive material. The planar base 204 may be configured in such a way that it may also help stabilize the device in an enclosure 113. For instance, when the device is placed into the enclosure 113 and a cover 112 is placed into position on the enclosure 113, the planar base 204 may have a force exerted on it from the force the cover 112 exerts on the other member of the device 200. The force exerted by the cover 112 may be translated to the planar base 204. The planar base 204 may translate the force back onto the cover 112. Based on Newton's Third Law, the cover 112 may exert the force back onto the planar base 204. Then, because the planar base 204 may be coupled to the first member 202, the planar base 204 may translate some of the force to the first planar prong 202 and help stabilize the planar base 204 and the rest of the device 200.

Furthermore, the planar base 204 may be formed to a shape that is captured by the cover 112 of the enclosure 113. As mentioned herein, the enclosure 113 does not entirely absorb an electromagnetic field, but has current running along its surface. Current typically takes the path of least resistance. Therefore, EMI may be transmitted when the enclosure 113 does not have a direct, low-resistive path. When the planar base 204 is formed in a shape that is captured by the cover 112 of the enclosure 113, the device 200 may establish a surface contact with the cover 112 of the enclosure 113, which may exhibit lower impedance than a point contact. This may decrease the EMI emissions that could have propagated.

The width of the planar base 204 may also be wide enough to adequately hold a side gasket 116, from FIG. 1, and help define a compartment for the side gasket 116. As mentioned herein, a gasket can help seal the enclosure 113 when force is applied. In combination with the device 200, the enclosure 113 may benefit from the sealing properties of the gasket and the low-impedance qualities of the device 200. This may also decrease the EMI emissions that could have propagated. Furthermore, gaskets require some amount of compressive force to function properly. As a result, a gasket may decrease in height. Many gaskets may need to be compressed to 40% of their original height to maintain contract with the enclosure 113 and the device 200 and maintain sealing properties.

In certain embodiments, a second planar prong 206 may be coupled to the planar base 204 of the device 200 and may be comprised of conductive material. The second planar prong 206 may be configured in such a way that it is substantially parallel to the side of the enclosure 113 and spaced from the side of the enclosure 113 by a distance to help define a compartment that can adequately hold the side gasket 116 when a force is applied to the second planar prong 206. For instance, a force may be exerted by the cover 112 onto other members of the device 200. The force may be translated to the second planar prong 206 and the second planar prong 206 may exert the force onto the side gasket 116 that is being held in a compartment created by the second planar prong 206, the planar base 204, and the side of the enclosure 113. The side gasket 116 may exert the force on the side of the enclosure 113, and based on Newton's Third Law, the side of the enclosure 113 may exert the force back on the side gasket 116, holding the side gasket 116 in place. This may allow the device 200 to provide the enclosure 113 with the sealing properties of a gasket and establish a surface contact with the enclosure 113, thus, decreasing the EMI emissions that could have propagated.

Consistent with various embodiments, a first planar member 208 may be coupled to a side of the second planar prong 206 of the device 200, opposite the compartment where the side gasket 116 may be placed. Furthermore, the first planar member 208 may be composed of a conductive material. The first planar member 208 may be configured in such a way that it is substantially perpendicular to the second planar prong 206, substantially parallel to the cover 112 of the enclosure 113, and spaced from the cover 112 of the enclosure 113 by a distance that defines a height of a compartment and can adequately hold the top gasket 118, from FIG. 1, when a force is applied to the first planar member 208. For instance, a force may be exerted by the cover 112 of the enclosure 113 onto the top gasket 118. The force may be translated to the first planar member 208 and the first planar member 208 may translate some of the force onto the second planar prong 206 by way of the coupling to the second planar prong 206. Furthermore, based on Newton's Third Law, the first planar member 208 may exert the force back on the top gasket 118, holding the top gasket 118 in place between the cover 112 of the enclosure 113 and the first planar member 208. This may allow the device 200 to provide the enclosure 113 with the sealing properties of a gasket and establish a surface contact with the enclosure 113, thus, decreasing the EMI emissions that could have propagated.

In certain embodiments, a second planar member 210 may be coupled to an end of the second planar prong 206 and an end of the first planar member 208 of the device 200 and may be composed of a conductive material. The second planar member 210 may be configured in such a way that it provides additional support for the second planar prong 206 and the first planar member 208. For instance, when the force is applied from the cover 112 of the enclosure 113 and is translated throughout the device 200, the force applied at the coupling points of the second planar prong 206 and the first planar member 208, may be substantial. By coupling the second planar member 210 to the ends of the second planar prong 206 and the first planar member 208, the force may be distributed more evenly across the members and possibly eliminate damage to the device 200.

Figure 3:
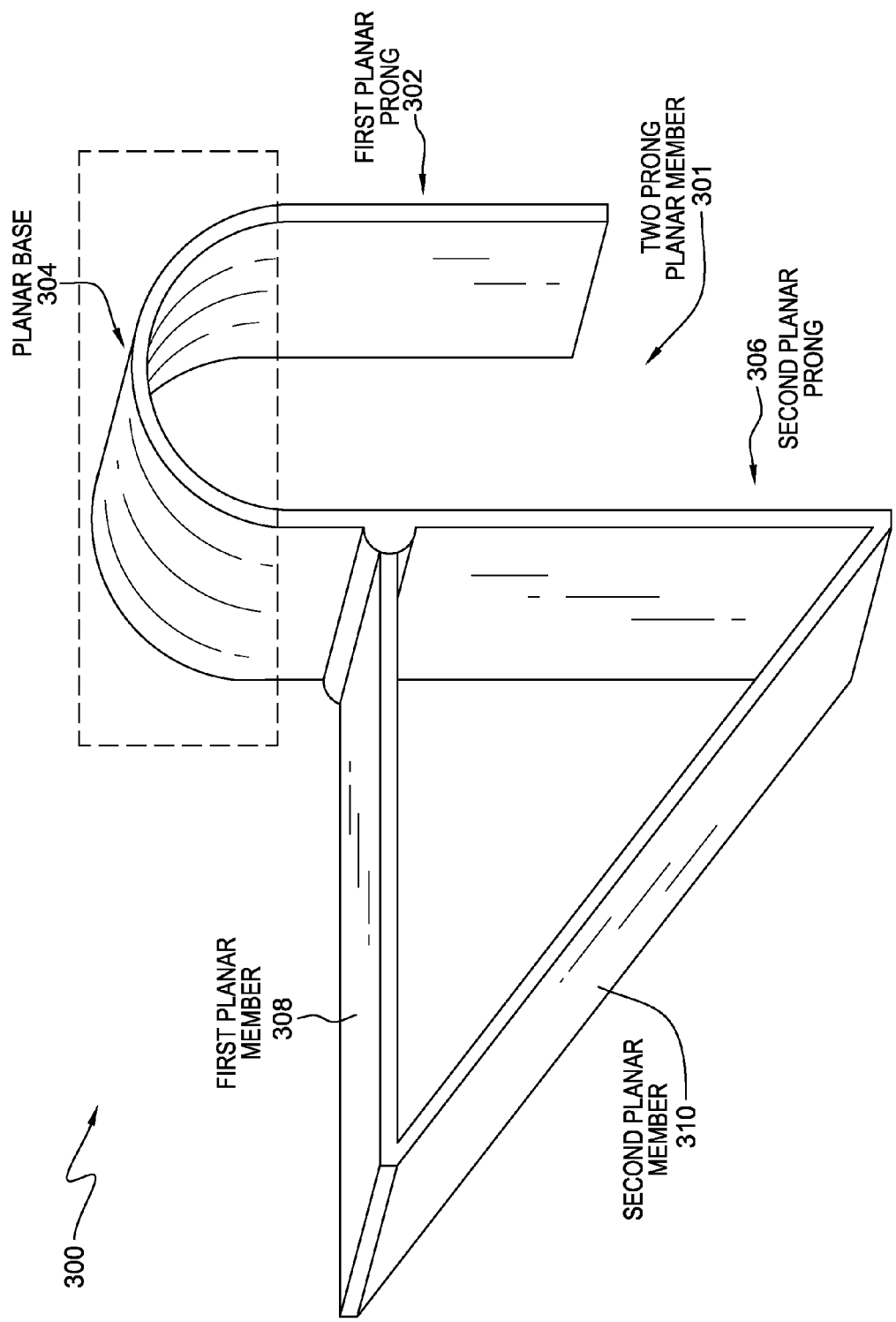
FIG. 3 depicts a device for attenuating the propagation and reception of electromagnetic emissions, consistent with embodiments of the present disclosure.

FIG. 3 depicts a device 300 for attenuating the propagation and reception of electromagnetic emissions, consistent with embodiments of the present disclosure. A two planar prong member 301 may be present on the device 300 and may be composed of a conductive material. The conductive material may allow for the movability of the current carrying charged particles, known as electrons, better than other materials like insulators. The use of a conductive material for the two planar prong member 301 may maintain a lower impedance connection between the two planar prong member 301 and the enclosure 113, from FIG. 1, than if an insulating material is used, therefore, providing a better connection for the signal to travel along the enclosure 113. Furthermore, the two planar prong member 301 may be composed of a first planar prong 302, a planar base 304, and a second planar prong 306.

The first planar prong member 302 may be configured in such a way that it may help stabilize the device 300 in the enclosure 113. For instance, when the device 300 is placed into an enclosure 113 and the cover 112, from FIG. 1, is placed into position on the enclosure 113, the first planar prong member 302 may have a force exerted on it from the force the cover 112 exerts on the other members of the device 300. The force exerted by the cover 112 may be translated to the first planar prong member 302 and the first planar prong member 302 may be thin enough to fit between the exterior side of the side wall 114, from FIG. 1, of the enclosure 113 and a side of the cover 112. When the force is exerted on the first planar prong member 302, the first planar prong member 302 may translate the force onto the side of the cover 112, and based on Newton's Third Law, for every force there is an equal and opposite force, the side of the cover 112 exerts the force back onto the first planar prong member 302. Then, because the first planar prong member 302 is between the exterior side of the side wall 114 of the enclosure 113 and the side of the cover 112, the first planar prong member 302, may exert the force on the exterior side of the side wall 114, stabilizing the first planar prong member 302 and the rest of the device 300.

Consistent with certain embodiments, a planar base 304 may be coupled to the first planar prong member 302 of the device 300 and may be composed of a conductive material. The planar base 304 may be configured in such a way that it may also help stabilize the device in an enclosure 113. For instance, when the device is placed into the enclosure 113 and a cover 112 is placed into position on the enclosure 113, the planar base 304 may have a force exerted on it from the force the cover 112 exerts on the other member of the device 300. The force exerted by the cover 112 may be translated to the planar base 304. The planar base 304 may translate the force back onto the cover 112. Based on Newton's Third Law, the cover 112 may exert the force back onto the planar base 304. Then, because the planar base 304 may be coupled to the first member 302, the planar base 304 may translate some of the force to the first planar prong member 302 and help stabilize the planar base 304 and the rest of the device 300.

Furthermore, the planar base 304 may be formed to a shape that is captured by the cover 112 of the enclosure 113. As mentioned herein, the enclosure 113 does not entirely absorb an electromagnetic field, but has current running along its surface. Current typically takes the path of least resistance. Therefore, EMI may be transmitted when the enclosure 113 does not have a direct, low-resistive path. When the planar base 304 is formed in a shape that is captured by the cover 112 of the enclosure 113, the device 300 may establish a surface contact with the cover 112 of the enclosure 113, which may exhibit lower impedance than a point contact. This may decrease the EMI emissions that could have propagated.

The width of the planar base 304 may also be wide enough to create a compartment and adequately hold the side gasket 116, from FIG. 1. As mentioned herein, the side gasket 116 can help seal the enclosure 113 when force is applied. In combination with the device 300, the enclosure 113 may benefit from the sealing properties of the side gasket 116 and the low-impedance qualities of the device 300. This may also decrease the EMI emissions that could have propagated. Furthermore, gaskets require some amount of compressive force to function properly. As a result, a gasket may decrease in height. Many gaskets may need to be compressed to 40% of their original height to maintain contract with the enclosure 113 and the device 300 and maintain sealing properties.

In certain embodiments, a second planar prong member 306 may be coupled to the planar base 304 of the device and may be comprised of conductive material. The second planar prong member 306 may be configured in such a way that it is substantially parallel to the side of the enclosure 113 and spaced from the side of the enclosure 113 by a distance to help define a compartment and can adequately hold the side gasket 116 when a force is applied to the second planar prong member 306. For instance, a force may be exerted by the cover 112 onto other members of the device 300. The force may be translated to the second planar prong member 306 and the second planar prong member 306 may exert the force onto the side gasket 116 that is being held in the compartment defined by the second planar prong member 306, the planar base 304, and the side of the enclosure 113. The side gasket 116 may exert the force on the side of the enclosure 113, and based on Newton's Third Law, the side of the enclosure 113 may exert the force back on the side gasket 116, holding the gasket in place. This may allow the device 300 to provide the enclosure 113 with the sealing properties of a gasket and establish a surface contact with the enclosure 113, thus, decreasing the EMI emissions that could have propagated.

Consistent with various embodiments, a first planar member 308 may be coupled to a side of the second planar prong member 306 of the device 300, opposite the compartment that the gasket may be placed. Furthermore the first planar member 308 may be composed of conductive material. The first planar member 308 may be configured in such a way that it is substantially perpendicular to the second planar prong member 306, substantially parallel to the cover 112 of the enclosure 113, and spaced from the cover 112 of the enclosure 113 by a distance that creates a compartment and can adequately hold the top gasket 118, from FIG. 1, when a force is applied to the first planar member 308. For instance, a force may be exerted by the cover 112 of the enclosure 113 onto the top gasket 118. The force may be translated to the first planar member 308 and the first planar member 308 may translate some of the force onto the second planar prong member 306 by way of the coupling to the second planar prong member 306. Furthermore, based on Newton's Third Law, the first planar member 308 may exert the force back on the top gasket 118, holding the top gasket 118 between the cover 112 of the enclosure 113 and the first planar member 308. This may allow the device 300 to provide the enclosure 113 with the sealing properties of a gasket and establish a surface contact with the enclosure 113, thus, decreasing the EMI emissions that could have propagated.

In certain embodiments, a second planar member 310 may be coupled to an end of the second planar prong member 306 and an end of the first planar member 308 of the device 300 and may be composed of a conductive material. The second planar member 310 may be configured in such a way that it provides additional support for the second planar prong member 306 and the first planar member 308. For instance, when the force is applied from the cover 112 of the enclosure 113 and is translated throughout the device 300, the force applied at the coupling points of the second planar prong member 306 and the first planar member 308 may be substantial. By coupling the second planar member 310 to the ends of the second planar prong member 306 and the first planar member 308, the force may be distributed more evenly across the members and possibly eliminate damage to the device 300.

While the invention has been described with reference to specific embodiments thereof, those skilled in the art will be able to make various modifications to the described embodiments without departing from the true spirit and scope of the embodiments. The terms and descriptions used herein are set forth by way of illustration only and are not meant as limitations. Those skilled in the art will recognize that these and other variations are possible within the spirit and scope of the embodiments as defined in the following claims and their equivalents.

The invention claimed is:

1. A device for attenuating propagation of electromagnetic emissions when in an installed position of an enclosure that includes a cover and a side, the device comprising:
  a two-prong member having:
    a first planar prong substantially adjacent to and substantially parallel with an exterior of the side of the enclosure,
    a second planar prong substantially parallel to and spaced from an interior of the side of the enclosure, configured to compress a first compressible gasket against the side of the enclosure, and forming a first compartment between a first side of the second planar prong and the interior of the side of the enclosure, and
    a planar base of the first planar prong and the second planar prong substantially adjacent to the cover;
  a first planar member having one end coupled substantially perpendicular to a second side of the second planar prong and configured to support a second compressible gasket in a second compartment formed between the planar member and the cover.

2. The device of claim 1, further comprising:
  a second planar member with a first end coupled to an end of the second planar prong, opposite the planar base and a second end coupled to a second end of the first planar member, opposite the one end of the first planar member.

3. The device of claim 1, wherein the first compressible gasket is compressed to at least 40 percent of an initial height of the first compressible gasket and the second compressible gasket is compressed to at least 40 percent of an initial height of the second compressible gasket.

4. The device of claim 1, wherein the device is a conductive material.

5. The device of claim 1, wherein the first compressible gasket is coupled to the second planar prong and the second compressible gasket is coupled to the first planar member.

6. The device of claim 1, wherein the first compressible gasket and the second compressible gasket are made of EMI shielding material.

7. A kit for attenuating propagation of electromagnetic emissions when in an installed position of an enclosure that includes a cover and a side, the kit comprising:
  a first compressible gasket;
  a second compressible gasket;
  a device having:
    a two-prong member having:
      a first planar prong substantially adjacent to and substantially parallel with an exterior of the side of the enclosure,
      a second planar prong substantially parallel to and spaced from an interior of the side of the enclosure, configured to compress a first compressible gasket against the side of the enclosure, and forming a first compartment between a first side of the second planar prong and the interior of the side of the enclosure, and
      a planar base of the first planar prong and the second planar prong substantially adjacent to the cover;
    a first planar member having one end coupled substantially perpendicular to a second side of the second planar prong and configured to support a second compressible gasket in a second compartment formed between the planar member and the cover.

8. The kit of claim 7, the device further comprising:
  a second planar member with a first end coupled to an end of the second planar prong, opposite the planar base and a second end coupled to a second end of the first planar member, opposite the one end of the first planar member.

9. The kit of claim 7, wherein the first compressible gasket is compressed to at least 40 percent of an initial height of the first compressible gasket and the second compressible gasket is compressed to at least 40 percent of an initial height of the second compressible gasket.

10. The kit of claim 7, wherein the device is a conductive material.

11. The kit of claim 7, wherein the first compressible gasket is coupled to the second planar prong and the second compressible gasket is coupled to the first planar member.

12. The kit of claim 7, wherein the first compressible gasket and the second compressible gasket are made of EMI shielding material.

13. A system for attenuating propagation of electromagnetic emissions, the system comprising:
   an enclosure having:
      a cover, and
      a side;
   a first compressible gasket;
   a second compressible gasket;
   a device having:
      a two-prong member having:
         a first planar prong substantially adjacent to and substantially parallel with an exterior of the side of the enclosure,
         a second planar prong substantially parallel to and spaced from an interior of the side of the enclosure, configured to compress a first compressible gasket against the side of the enclosure, and forming a first compartment between a first side of the second planar prong and the interior of the side of the enclosure, and
         a planar base of the first planar prong and the second planar prong substantially adjacent to the cover;
      a first planar member having one end coupled substantially perpendicular to a second side of the second planar prong and configured to support a second compressible gasket in a second compartment formed between the planar member and the cover.

14. The system of claim 13, the device further comprising:
   a second planar member with a first end coupled to an end of the second planar prong, opposite the planar base and a second end coupled to a second end of the first planar member, opposite the one end of the first planar member.

15. The system of claim 13, wherein the first compressible gasket is compressed to at least 40 percent of an initial height of the first compressible gasket and the second compressible gasket is compressed to at least 40 percent of an initial height of the second compressible gasket.

16. The system of claim 13, wherein the device is a conductive material.

17. The system of claim 13, wherein the first compressible gasket is coupled to the second planar prong and the second compressible gasket is coupled to the first planar member.

18. The system of claim 13, wherein the enclosure is a conductive material.

19. The system of claim 13, wherein the first compressible gasket and the second compressible gasket are made of EMI shielding material.

* * * * *